(12) United States Patent
Tokita (10) Patent No.: US 7,053,983 B2
(45) Date of Patent: May 30, 2006

(54) LIQUID IMMERSION TYPE EXPOSURE APPARATUS

(75) Inventor: Toshinobu Tokita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 38 days.

(21) Appl. No.: 10/931,572

(22) Filed: Sep. 1, 2004

(65) Prior Publication Data
US 2005/0233081 A1    Oct. 20, 2005

(30) Foreign Application Priority Data
Sep. 4, 2003  (JP)  ............... 2003-312635

(51) Int. Cl.
*G03B 27/42* (2006.01)
*G03B 27/52* (2006.01)

(52) U.S. Cl. .......................... 355/53; 355/30

(58) Field of Classification Search .............. 355/30, 355/53, 55; 250/548
See application file for complete search history.

(56) References Cited

U.S. PATENT DOCUMENTS 5,825,043 A * 10/1998 Suwa .................... 250/548
6,522,385 B1 * 2/2003 Ahn et al. ............... 355/30
6,867,844 B1 * 3/2005 Vogel et al. ............. 355/30

FOREIGN PATENT DOCUMENTS

| JP | 06-124873 | 5/1994 |
| WO | WO 99/49504 | 9/1999 |

* cited by examiner

*Primary Examiner*—Henry Hung Nguyen
(74) *Attorney, Agent, or Firm*—Morgan & Finnegan, LLP (57) ABSTRACT

Disclosed is an exposure apparatus which includes a projection optical system for projecting a pattern of a reticle onto a substrate, wherein the substrate is exposed through a liquid medium kept at least in a portion between the substrate and an optical element of the projection optical system which optical element is nearest to the substrate, a supplying system for supplying a liquid medium, a collecting system for collecting a liquid medium, and an exhausting system for removing a bubble in the liquid medium through a bubble removing material having such property that it passes a gas but it does not pass a liquid.

15 Claims, 9 Drawing Sheets

LIQUID IMMERSION TYPE EXPOSURE APPARATUS

FIELD OF THE INVENTION AND RELATED ART

This invention relates to an exposure apparatus to be used in a lithographic process for manufacture of devices such as semiconductor integrated circuit, image pickup device (CCD), liquid crystal display device or thin film magnetic head, for example. More particularly, the invention concerns a liquid immersion type exposure apparatus in which a substrate is exposed through a liquid medium supplied into at least a portion between a projection optical system and the substrate.

In liquid immersion type exposure apparatuses, a liquid medium is interposed between a substrate to be exposed and one of optical elements, constituting a projection optical system, which one is nearest to the substrate. Since the numerical aperture (NA) can be increased thereby, attainment of higher resolution is expected. In relation to such liquid immersion type exposure apparatus, a method in which a substrate to be exposed as a whole is immersed in a liquid, and a method in which a liquid is interposed only between a substrate to be exposed and an optical element nearest to the substrate have been proposed (for example, Japanese Laid-Open Patent Application, Publication No. 6-124873 and PCT International Publication WO99/49504).

"Extreme-NA Water Immersion Lithography for 35–65 nm Technology", by Bruce Smith et al (Rochester Institute of Technology), in International Symposium on 157 nm Lithography, 3–6, September 2002, at Belgium, discusses immersion liquid supplying and collecting methods for liquid immersion type exposure apparatus.

Figure 7:
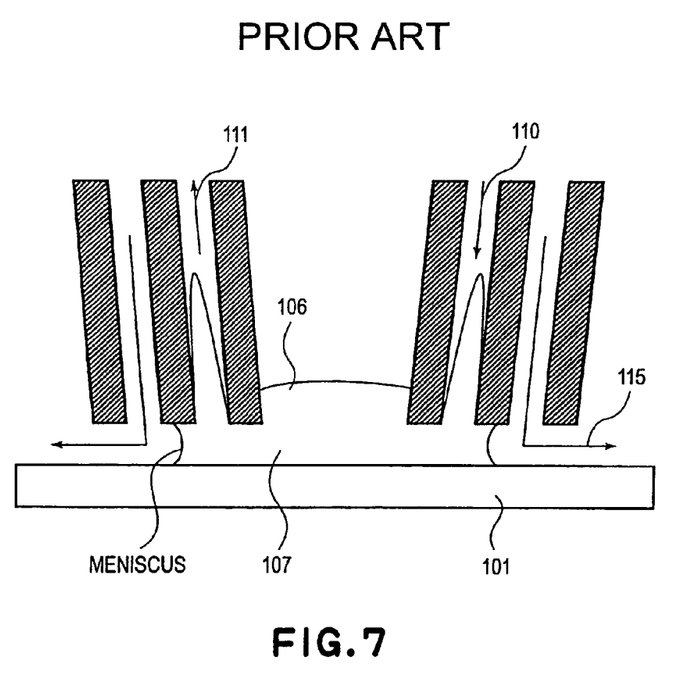
FIG. 7 is a schematic view for explaining a liquid immersion type exposure apparatus of conventional structure.

FIG. 7 illustrates an example. In FIG. 7, denoted at 110 is a liquid supplying nozzle for supplying a liquid medium, and denoted at 111 is a liquid collecting nozzle for collecting the liquid. Denoted at 115 is an air curtain for preventing the liquid medium from leaking outwardly.

The liquid supplying nozzle 110 is mounted in the vicinity of the edge portion of a final lens 106 of a projection optical system, and it supplies a liquid medium 107 toward the opposed surfaces of a substrate 101 and the final lens 106 of the projection optical system. The liquid collecting nozzle 111 is mounted on a side of the final lens 106, remote from the liquid supplying nozzle, collects the liquid medium. Additionally, there is an air curtain 115 outwardly of these nozzles, which curtain is produced by blowing a compressed air, such that the liquid medium between the substrate 101 and the final lens 106 is held there.

Although any air curtain is not used, aforementioned PCT International Publication WO99/49504 shows a similar structure as of FIG. 7 in relation to a liquid supplying nozzle and liquid collecting nozzle. PCT WO99/49504 further discloses adjusting the supplying rate and collecting rate of liquid medium 107 in accordance with the movement speed of the substrate 101.

In the structure shown in FIG. 7, adjustment of the air curtain provided by compressed airs is difficult to achieve, and there is a possibility that airs are mixed into the liquid medium. Furthermore, due to the flow of liquid following the stepwise motion or scan motion of the substrate stage, the meniscus produced at the boundary between the liquid and the outside ambience is easily broken, and since in that occasion the meniscus produced at the boundary of the liquid is close to the final lens 106, bubbles are easily mixed into the liquid between the substrate 101 and the final optical lens 106. Once bubbles are mixed into the liquid medium, it disturbs the exposure and thus the exposure transfer precision is degraded thereby. This leads to a decrease of yield of semiconductor device production.

There is an additional problem that, since it is difficult to hold a constant pressure applied to the liquid by the air curtain, a change in the pressure inside the liquid medium causes a change of liquid density. As a result, the refractive index thereof easily varies to cause variation of the numerical aperture (NA) of the optical system. This results in degradation of the exposure transfer precision and, thus, a decrease of yield in the semiconductor device manufacture.

Additionally, there is a possibility that the liquid is scattered outwardly when mixed in the air flow of the air curtain. Such liquid may cause damage of structural components of the exposure apparatus. If it occurs actually, the operation of the exposure apparatus has to be stopped for repair or adjustment, and it results in a large decrease of productivity in the semiconductor device manufacture.

On the other hand, in the structure disclosed in PCT International Publication WO99/49504, the amount of liquid supply and the amount of liquid collection are adjusted in accordance with the moving speed of the substrate. However, since the motion of the substrate includes acceleration and deceleration, it is difficult to adjust the liquid supplying rate and liquid collecting rate exactly at high precision in accordance with the moving speed. If the liquid supplying rate and liquid collecting rate can not be adjusted at high precision, then it is difficult to maintain the pressure inside the liquid constant. This means that, with a change in pressure of the liquid, the liquid density changes and, as a result, the refractive index varies easily which in turn causes variation of the numerical aperture (NA) of the optical system. This results in degradation of the exposure transfer precision and, thus, a decrease of yield in the semiconductor device manufacture.

Furthermore, in the structure shown in FIG. 7 and in the structure disclosed in PCT International Publication WO99/49504, there is a common problem that, since the position for liquid supply and collection is restricted, the degree of freedom of the movement direction for the stepwise motion and scan motion is lowered. If the degree of freedom of the driving direction of the stepwise motion or scan motion is low, it leads to a decrease of the throughput and thus a decrease of the productivity in the semiconductor device manufacture.

SUMMARY OF THE INVENTION

It is accordingly an object of the present invention to provide an improved liquid immersion type exposure apparatus.

It is another object of the present invention to provide an exposure apparatus by which mixture of bubbles into a liquid medium maintained between a substrate to be exposed and an optical element of a projection optical system, nearest to the substrate, is prevented effectively and by which pressure variation of the liquid medium is held low, that is, variation of refractive index of the liquid medium is held low, such that a high resolution is assured.

Specifically, in accordance with an aspect of the present invention, there is provided an exposure apparatus, comprising: a projection optical system for projecting a pattern of a reticle onto a substrate, wherein the substrate is exposed through a liquid medium kept at least in a portion between the substrate and an optical element of said projection optical system which optical element is nearest to the substrate; a supplying system for supplying a liquid medium; a collecting system for collecting a liquid medium; and an exhausting system for removing a bubble in the liquid medium through a bubble removing material having such property that it passes a gas but it does not pass a liquid.

In accordance with another aspect of the present invention, there is provided an exposure apparatus, comprising: a-projection optical system for projecting a pattern of a reticle onto a substrate, wherein the substrate is exposed through a liquid medium kept at least in a portion between the substrate and an optical element of said projection optical system which optical element is nearest to the substrate; a supplying system for supplying a liquid medium; a collecting system for collecting a liquid medium; and an exhausting system for removing a bubble in the liquid medium through a porous material.

In accordance with a further aspect of the present invention, there is provided an exposure apparatus, comprising: a projection optical system for projecting a pattern of a reticle onto a substrate, wherein the substrate is exposed through a liquid medium kept at least in a portion between the substrate and an optical element of said projection optical system which optical element is nearest to the substrate; a supplying system for supplying a liquid medium through a porous material; and a collecting system for collecting a liquid medium.

In accordance with a yet further aspect of the present invention, there is provided a device manufacturing method, comprising the steps of: exposing a substrate by use of any one of the exposure apparatuses as recited above; and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

[Embodiment 1]

Figure 1:
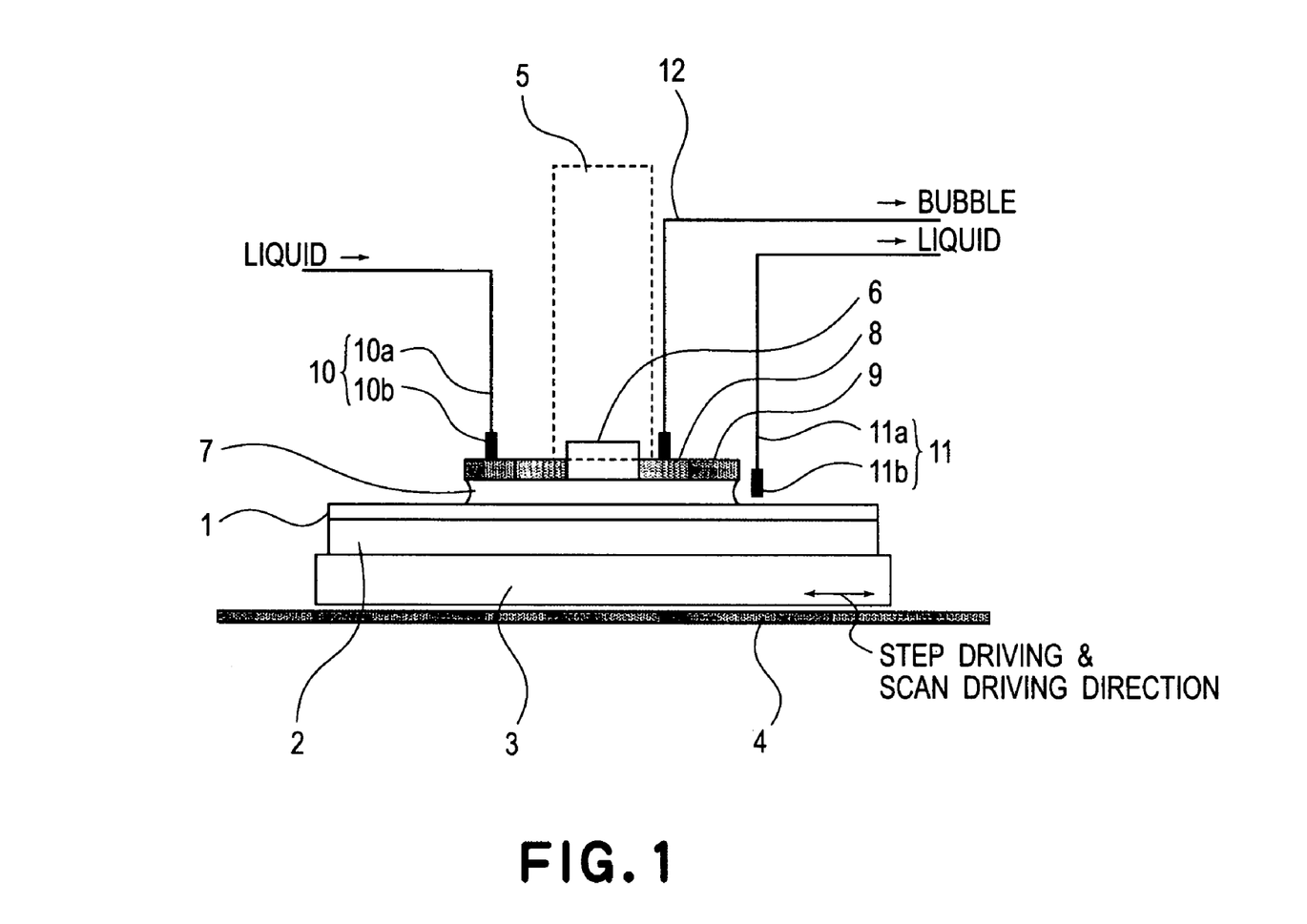
FIG. 1 is a schematic view of a structure of a liquid immersion type exposure apparatus according to a first embodiment of the present invention.

FIG. 1 is a schematic view showing a liquid immersion type exposure apparatus according to an embodiment of the present invention.

A substrate 1 that is an object onto which a circuit pattern or the like is to be transferred, is held by a substrate holder 2 in accordance with a vacuum holding method or an electrostatic holding method. The substrate holder 2 is mounted on a substrate stage 3 which is arranged to perform stepwise motion or scan motion to follow a stage base table 4. In the stepwise motion or scan motion, the substrate stage 3 is controlled on the basis of the result of measurement made through an autofocus (AF) sensor, not shown, so that the substrate 1 is held at a predetermined level (height).

On the other hand, the optical system includes a light source (not shown), an illumination system for illuminating a reticle having a transfer pattern with light from the light source, and a projection optical system mounted inside a barrel 5. The projection optical system includes an optical element (final optical element) which is nearest to the substrate. A liquid medium 7 is, as a feature of a liquid immersion type exposure apparatus, held between the substrate 1 and the final optical element 6. The liquid medium 7 may be water or fluorine compound, for example, and it may be chosen in accordance with the type of a resist applied onto the substrate 1 or the wavelength of exposure light, for example.

In this embodiment, a first porous material 8 and a second porous material 9 are provided around the final optical element 6. The first porous material 8 comprises a fine and continuous porosity structure, for example, which can be formed by extending (drawing) polytetrafluoroetylene (PTFE), for example, and which has such property that it passes gas but it does not pass liquid 7. The second porous material 9 has such property that it absorbs liquid 7 on the basis of capillary phenomenon inside the porosity, like a sponge. A liquid supplying system 10 supplies a liquid medium 7 through the second porous material 9 to between the substrate 1 and the final optical element 6. The liquid supplying system 10 comprises a liquid supply source, a liquid supplying tube 10a, and a liquid supplying nozzle 10b at the tip end of the liquid supplying tube. The liquid supplying nozzle 10b is connected to or approximately connected to the second porous material 9. The whole second porous material 9 is operable to absorb liquid 7 and, when the amount of absorption is saturated, it can supply the liquid. Therefore, the liquid 7 can be supplied from the whole surface of the porous material, being opposed to the substrate 1. Here, the amount of supply of the liquid 7 from the nozzle 10b to the second porous material 9 may preferably be controlled by a first controller (not shown) so as to maintain a state that the amount of liquid 7 absorption of the second porous material 9 is continuously saturated. Any liquid 7 remaining on the substrate 1 as a result of stepwise motion or scan motion of the substrate stage 3 is collected by a liquid collecting system 11. The liquid collecting system 11 comprises a liquid collecting pump, a liquid collecting tube 11a, and a liquid collecting nozzle 11b at the tip end of the liquid collecting tube. The amount of liquid collection is controlled by means of a second controller (not shown) so that it becomes substantially equal to the liquid supply amount as controlled by the first controller. Although the liquid collecting nozzle 11b is disposed at the outer periphery of the second porous material 9, the position thereof may be chosen arbitrarily provided that it is along the outer periphery of the final optical element 6. A vacuum evacuation system 12 is connected to the first porous material 8, by which only bubbles within the liquid medium 7 can be removed. Thus, with this arrangement, bubbles, if any, being mixed into the supplied liquid medium 7 can be removed before they enter into between the substrate 1 and the final optical element 6.

Figure 2:
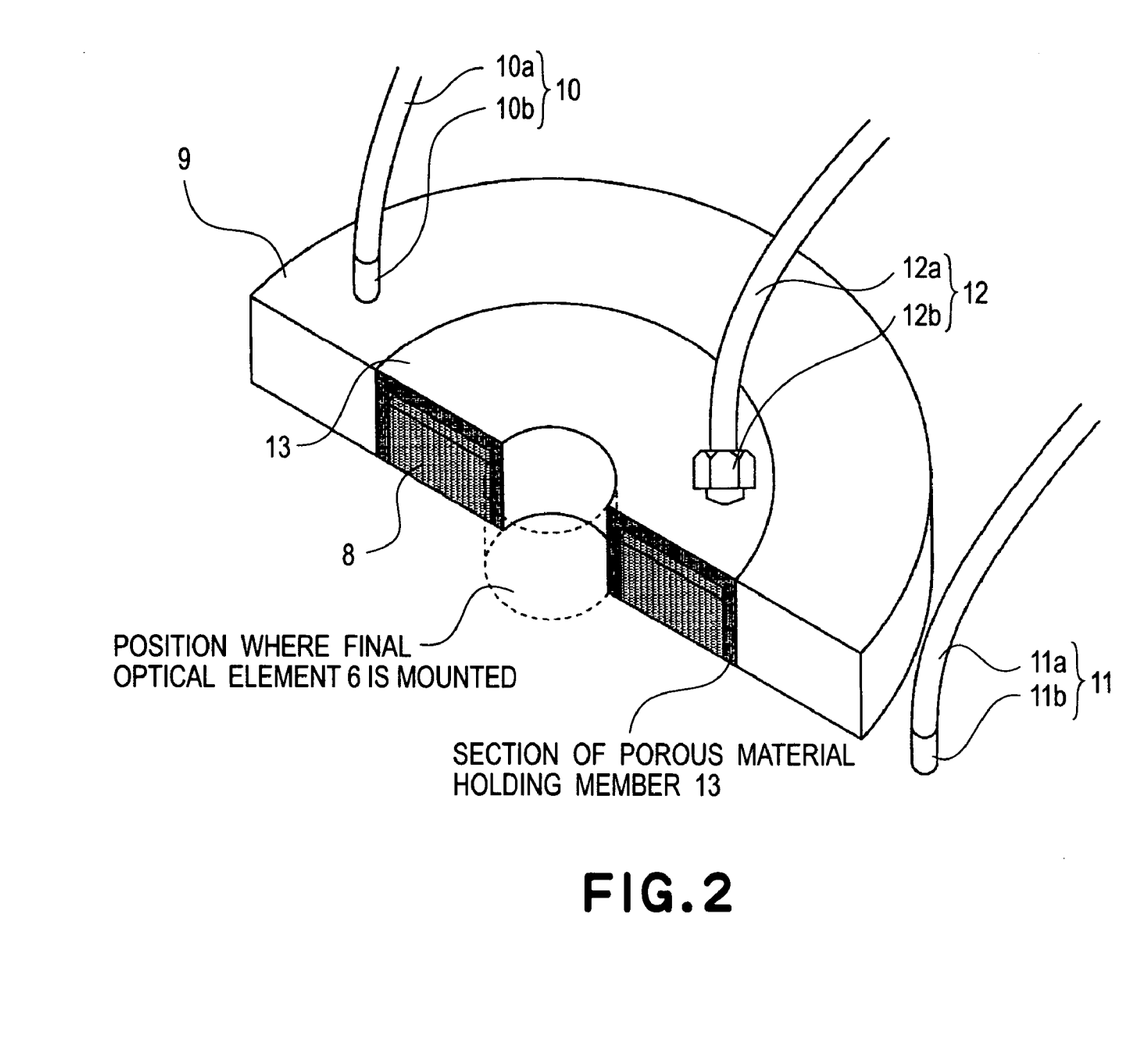
FIG. 2 is a fragmentary view, showing a porous material and related components in a liquid immersion type exposure apparatus according to the first embodiment of the present invention.

Next, referring to FIG. 2, the structure around the porous material will be explained. FIG. 2 illustrates the structure around the first porous material 8 and the second porous material 9, in a liquid immersion type exposure apparatus according to this embodiment of the present invention.

In FIG. 1, for simplicity of illustration of the apparatus structure, the first porous material 8 is disposed directly around the final optical element 6 and, additionally, the vacuum evacuation system 12 is directly connected to the first porous material 8. With this structure, however, only an ambience at the contact portion between the first porous material 8 and the vacuum evacuation system 12 can be discharged through the vacuum evacuation system 12, and therefore the function of the first porous material 8 for removing bubbles mixed into the liquid medium 7 does not operate well. In consideration of it, a porous-material holding member 13 is provided additionally. The porous-material holding member 13 has a space defined inside thereof, for accommodating the final optical element 6. Outside the porous-material holding member 13, the second porous material 9 can be mounted. The first porous material 8 is accommodated within the porous-material holding member 13. The face thereof to be opposed to the substrate 1 (bottom face as viewed in FIG. 2) is opened so that it can be directly opposed to the first porous material 8. The porous-material holding member 13 may be made of metal such as stainless steel or aluminum, for example, or glass. In FIG. 2, there is a clearance between the top of the first porous material 8 and the porous-material holding member 13. Except this, preferably, no clearance should be defined at any other engagement surfaces. If there is a clearance between the top of the first porous material 8 and the porous-material holding member 13, such clearance may preferably function as a buffer for vacuum evacuation. However, such clearance is not always necessary. The vacuum evacuation system 12 comprises a bubble evacuating tube 12a connected to an exhausting pump, for exhausting bubbles mixed in the liquid medium 7, and a connector 12b for connecting the bubble evacuation tube 12a with the porous-material holding member 13. Thus, there is a clearance between the top of the porous material 8 and the babble evacuating tube 12a.

In FIG. 2, the liquid supplying system 10, the light collecting system 11 and the vacuum evacuation system 12 are illustrated singly. However, the invention is not limited to this form, and the number of these components as well as positions of them can be chosen arbitrarily. As an example, since the stepwise motion or scan motion of the substrate stage 3 accompanies reciprocal motion of the substrate stage 3, taking it into account, preferably there should be liquid supplying systems 10 and liquid collecting systems 11 mounted in opposite directions with respect to the stepwise movement direction or scan movement direction.

Figure 3:
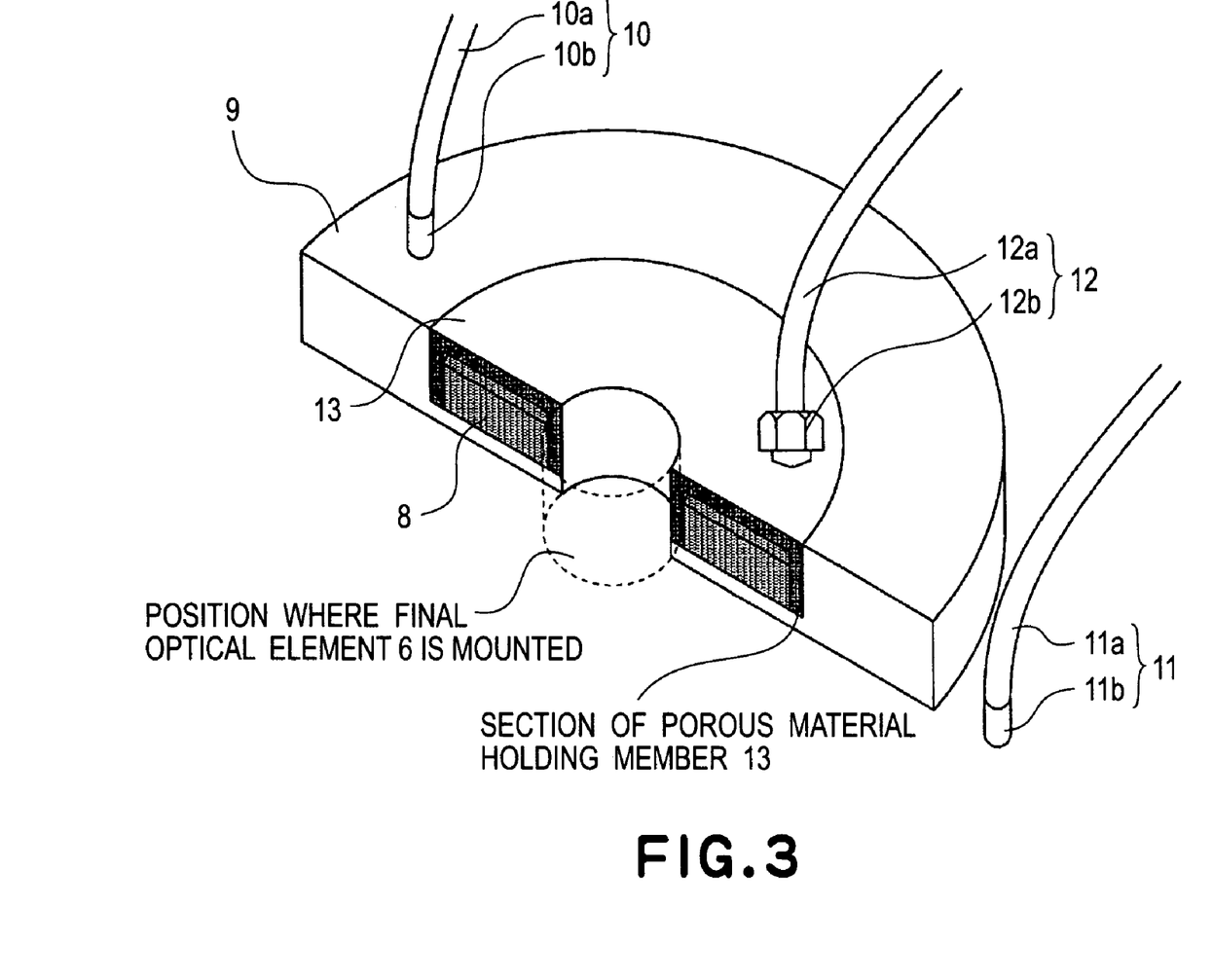
FIG. 3 is a fragmentary view, showing a porous material and related components in a liquid immersion type exposure apparatus according to the first embodiment of the present invention.

In FIGS. 1 and 2, two kinds of porous materials are disposed in an order of first porous material 8 and second porous material 9, from the final optical element 6 side. However, the order may be reversed. Alternatively, plural layers may be provided in an alternate fashion. For example, as shown in FIG. 3, a first porous material 8 and a second porous material 9 may be provided at the outer periphery of the final optical element 6. With this arrangement, any bubbles mixed into the liquid medium 7 can be removed by way of the first porous material 8, such that the liquid medium 7 can be supplied stably from the whole surface of the second porous material 9. Namely, for the liquid supply, it is ensured that the liquid is supplied from a range as wide as possible, and by doing so, the flow rate per unit area can be decreased.

As regards the first porous material 8, it is not limited to a porosity material provided that it has a property of passing a gas but not passing liquid 7. Similarly, the second porous material 9 is not limited to a porosity material provided that it has a property of absorbing liquid 7.

In FIGS. 1 and 2, the first porous material 8 and the second porous material 9 are held at the same level (height) as the substrate-side face of the final optical element 6. In FIG. 3, on the other hand, the second porous material 9 is held at the same level as the substrate-side face of the final optical element 6. The clearance between the substrate 1 and the final optical element 6 is in a range of tens microns to millimeter order. As shown in FIGS. 1–3, the first porous material 8 and/or the second porous material 9 should desirably be held at the same level as the substrate-side face of the final optical element 6. However, this is not a requisition. The clearance between the substrate 1 and the first porous material 8 or second porous material 9 may be chosen arbitrarily.

The first porous material 8 or the porous-material holding member 13 as well as the second porous material 9 are illustrated as having a concentric shape as of the final optical element 6. However, this is not a requisition, and any shape such as a square shape may be chosen arbitrarily.

Although it is preferable that the first porous material 8 and the second porous material 9 are each provided along the entire circumference of the final optical element 6, only it is necessary that they are provided at least in a portion of the circumference of the final optical element 6, along the stepwise direction or scan direction. Also, the size of the first and second porous materials 8 and 9 is not limited to such proportion, with respect to the size of the final optical element 6, as illustrated in the drawing. It may be chosen arbitrarily. Furthermore, while an example wherein the porous-material holding member 13 covers only the first porous material 8, the invention is not limited to this. It may be arranged to cover the second porous material 9 as well.

[Embodiment 2]

Figure 4:
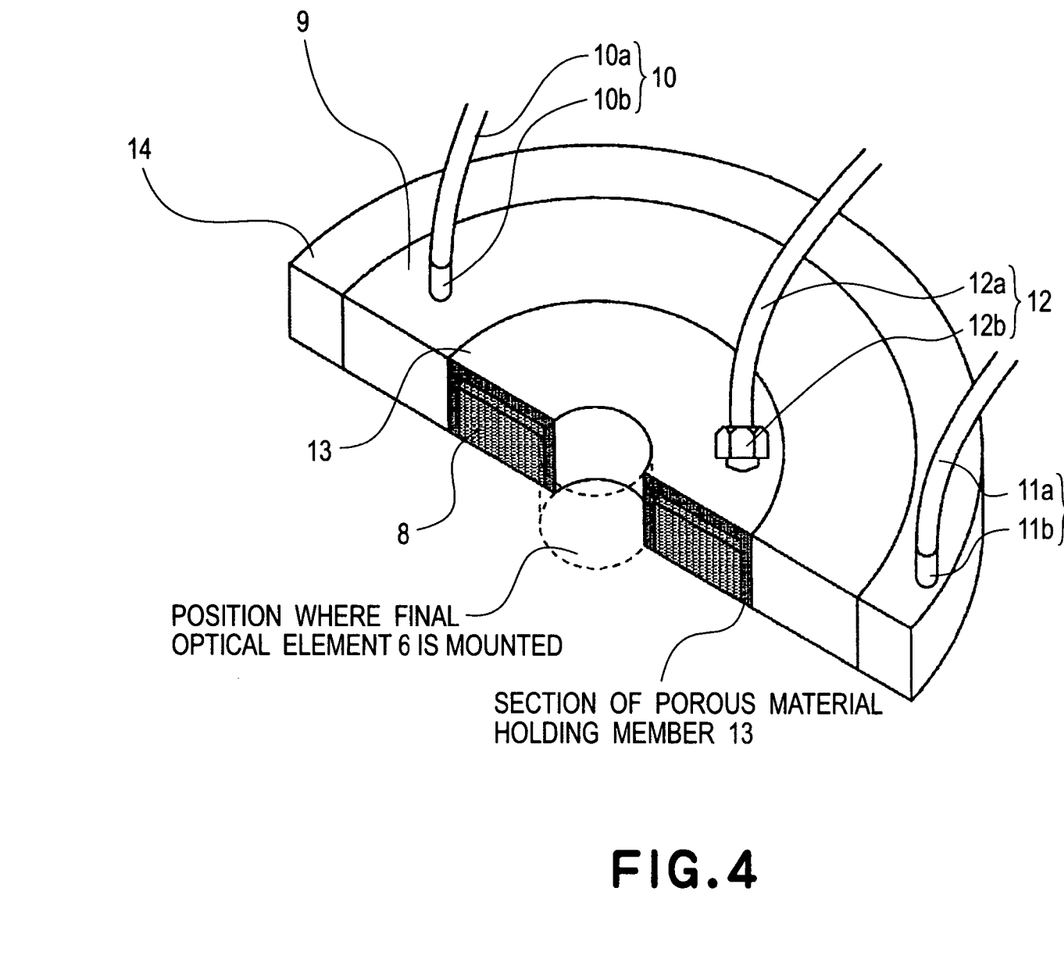
FIG. 4 is a fragmentary view, showing a porous material and related components in a liquid immersion type exposure apparatus according to a second embodiment of the present invention.

FIG. 4 illustrates the structure around first to third porous materials in a liquid immersion type exposure apparatus according to another embodiment of the present invention.

In the first embodiment, a residual liquid medium 7 left on the substrate 1 is directly collected by the liquid collecting system 11. In this embodiment, on the other hand, a third porous material (liquid collecting material) 14 is provided additionally, so that a liquid 17 is collected through the third porous material 14. Description of similar structure and function of this embodiment, like those of the first embodiment, will be omitted to avoid duplication.

The third porous material 14 may have such property that it holds a liquid medium 7 on the basis of capillary phenomenon inside the porosity, like a sponge, and a similar porosity material as of the second porous member may be used. The liquid collecting system 11 is connected or approximately connected to the third porous material 14. The third porous material is normally used in a state that no liquid 7 is absorbed thereby, that is, it is being dry, and it functions to remove any liquid medium 7 remaining on the substrate 1. As regards the amount of liquid correction here, preferably it is controlled by a second controller (not shown) to ensure that the amount of absorption of liquid 7 by the third porous material 14 is not saturated, thereby to keep its liquid absorbing capacity continuously. Here, if the second porous material 9 having absorbed the liquid 7 sufficiently and the third porous material 14 not having absorbed the liquid 7 are disposed in juxtaposition, it is possible that the liquid medium 7 absorbed by the second porous material 7 is directly absorbed by the third porous material 14, degrading the function of the third porous material 14 for removal of residual liquid 7 on the substrate 1. In consideration of it, there should be a wall between the second porous material 7 and the third porous material 14, although it is not illustrated in FIG. 4.

As regards the method of collecting liquid 7, in the foregoing description, the liquid is once absorbed by the third porous material 14 and then is collected by the liquid collecting system 11. However, the invention is not limited to this. For example, the liquid collecting system 11 may be omitted if the third porous material 14 can absorb a sufficient amount of liquid 7. In that occasion, after it absorbs a predetermined amount of liquid 7 or after completion of exposures of substrates of a predetermined number, the porous material may be replaced by fresh one or one having been dried. In this case, suitable replacing means for replacing the third porous material by another is necessary.

As has been described with reference to the first embodiment, the clearance between the substrate 1 and the final optical element 6 is in a range from tens microns to millimeter order. Similarly to the first porous material 8 and the second porous material 9, it is desirable that the third porous material is held at the same level as the substrate-side face of the final optical element 6. However, it is not a requisition, and the clearance between the substrate and the first, second or third porous material 8, 9 or 14 may be chosen arbitrarily. Furthermore, like the first porous material 8 or the porous-material holding member 13 as well as the second porous material 9, the third porous material 14 is illustrated as having a concentric shape as of the final optical element 6. However, this is not a requisition, and any shape such as a square shape may be chosen arbitrarily.

Although it is preferable that the first porous material 8, the second porous material 9 and the third porous material 14 are each provided along the entire circumference of the final optical element 6, only it is necessary that they are provided at least in a portion of the circumference of the final optical element 6, along the stepwise direction or scan direction. Also, the size of the first, second and third porous materials 8, 9 and 14 is not limited to such proportion, with respect to the size of the final optical element 6, as illustrated in the drawing. It may be chosen arbitrarily. Furthermore, while an example wherein the porous-material holding member 13 covers only the first porous material 8, the invention is not limited to this. It may be arranged to cover the second porous material 9 or the third porous material 14 as well.

The first porous material is not limited to a porosity material provided that it has a property for absorbing liquid 7.

[Embodiment 3]

Figure 5:
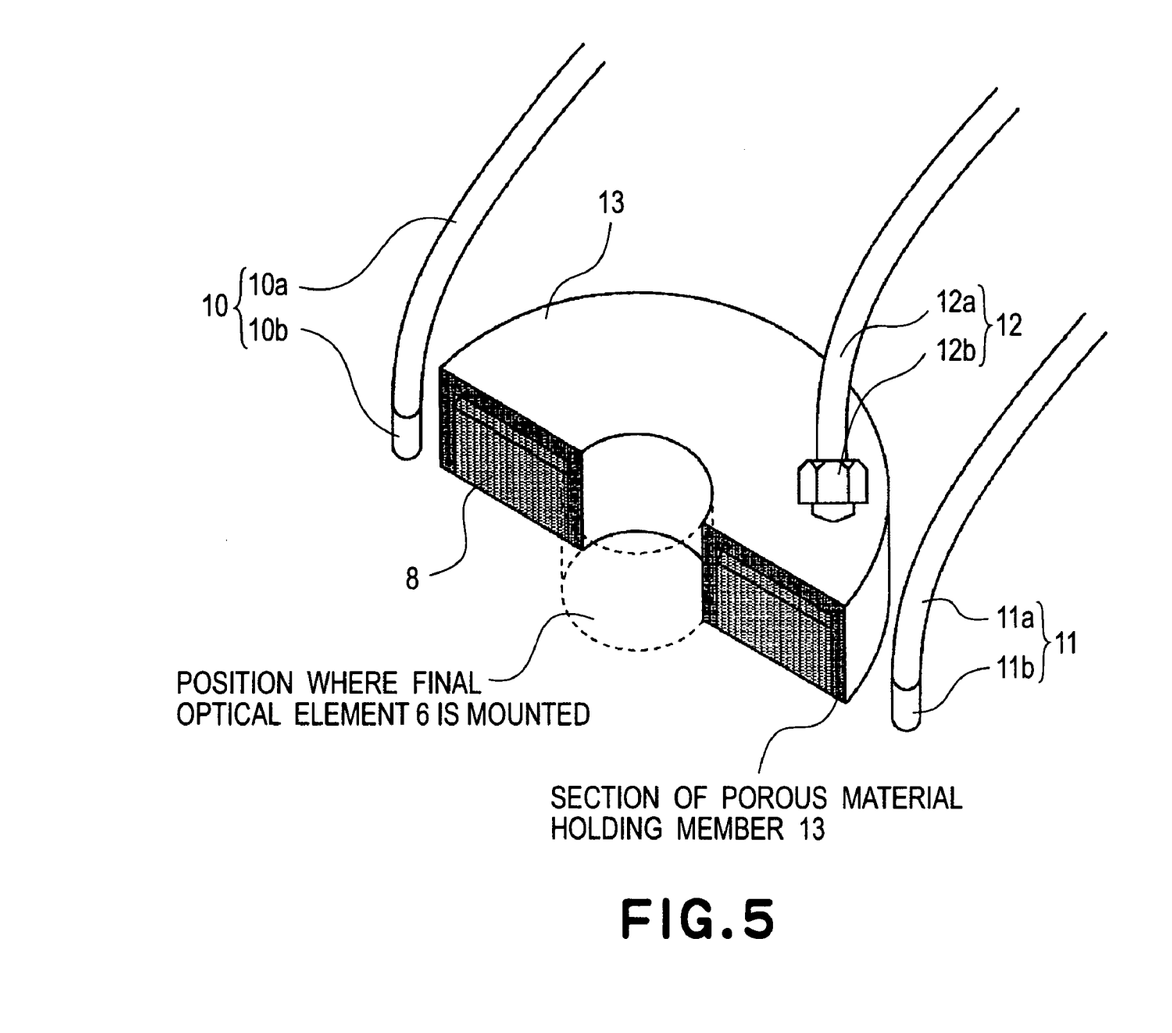
FIG. 5 is a fragmentary view, showing a porous material and related components in a liquid immersion type exposure apparatus according to a third embodiment of the present invention.

FIG. 5 illustrates the structure around a first porous material in a liquid immersion type exposure apparatus according to a further embodiment of the present invention.

The first and second embodiments have been described with reference to examples wherein a plurality of porous materials are used to perform liquid supply, liquid collection and removal of bubbles mixed in the liquid 7. In the third embodiment, a first porous material 8 is used as the porosity member and, by using nozzles mounted around it, liquid is supplied and collected. Description of similar structure and function of this embodiment, like those of the first or second embodiment, will be omitted to avoid duplication.

The first porous material 8 is hold within a porous-material holding member 13. Outside the porous-material holding member 13, there is a vacuum evacuation system 12 so that any bubbles mixed into the liquid 17 can be removed through the vacuum evacuation system 12. Also mounted at the outside periphery of the porous-material holding member 13 are a liquid supplying system 10 and a liquid collecting system 11. The liquid supplying system 10 supplies a liquid medium 7 to between the substrate 1 and the final optical element 6, and the liquid collecting system 11 collect the liquid 7. The structure for collecting any residual liquid 7 left on the substrate 1 is not limited to direct collection using the liquid collecting system 11. As described with reference to the second embodiment, a third porous material 14, not shown in FIG. 5, may be mounted around the porous-material holding member 13.

[Embodiment 4]

Figure 6:
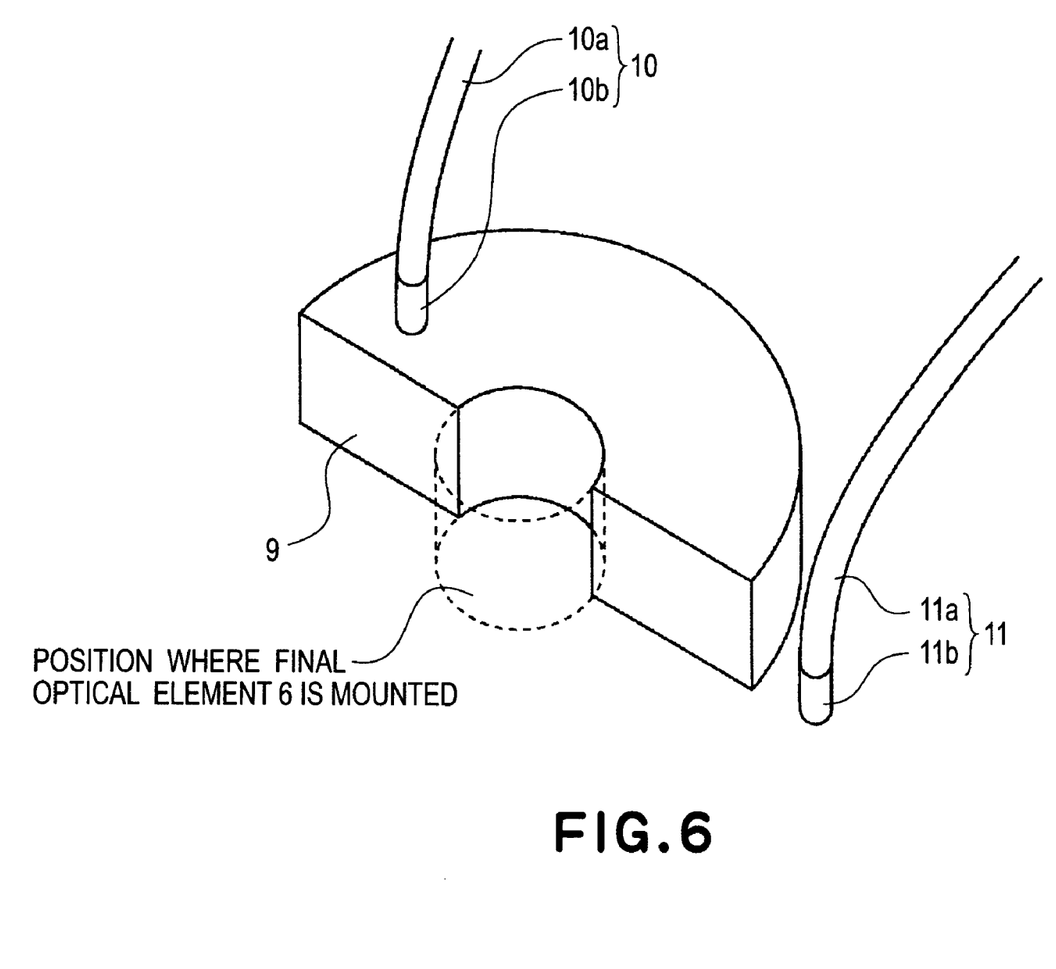
FIG. 6 is a fragmentary view, showing a porous material and related components in a liquid immersion type exposure apparatus according to a fourth embodiment of the present invention.

FIG. 6 illustrates the structure around a second porous material in a liquid immersion type exposure apparatus according to a fourth embodiment of the present invention.

The first and second embodiments have been described with reference to examples wherein a plurality of porous materials are used to perform liquid supply, liquid collection and removal of bubbles mixed in the liquid 7. In the forth embodiment, a second porous material 9 is used as the porosity member, and through the second porous material 9, the liquid is collected. The liquid is collected by using a nozzle mounted around it. Description of similar structure and function of this embodiment, like those of the first or second embodiment, will be omitted to avoid duplication.

The structure for collecting any residual liquid 7 left on the substrate 1 is not limited to direct collection using the liquid collecting system 11. As described with reference to the second embodiment, a third porous material 14, not shown in FIG. 6, may be mounted around the porous-material holding member 13.

In accordance with some preferred embodiments of the present invention as described hereinbefore, in a liquid immersion type exposure apparatus, a liquid medium can be held between a substrate and a final optical element assuredly. As a result, there is no necessity of using an air curtain and, second, there is no possibility that, due to the air curtain, bubbles are mixed into the liquid medium between the substrate and the final optical element. Furthermore, because of the provision of porous material member, the meniscus produced at the boundary between the liquid medium and the outside ambience is separated away from the final optical element. Therefore, even if the meniscus is broken, bubbles are not mixed into the liquid between the substrate and the final optical element. As a result, degradation of the exposure transfer precision owing to the bubbles within the liquid can be avoided. Moreover, since the liquid supplying and/or collecting method without using an air curtain just applies only a required flow rate from the porous material, pressure variation can be well suppressed and, thus, the liquid density does not change. Therefore, any change in the refractive index of the liquid medium can be well suppressed and, in turn, a change in the numerical aperture (NA) of the optical system can be avoided. Consequently, degradation of the exposure transfer precision due to variation in NA of the optical system can be prevented. Additionally, since the structure is such that liquid supply and liquid collection are made while surrounding the exposure region, the degree of freedom for the stepwise motion or scan motion is enlarged and, therefore, the throughput can be improved. Moreover, since any residual liquid adhered to the substrate can be collected without being scattered into the projection exposure apparatus, damage of any structural components due to the scattered liquid can be prevented and unwanted interruption of the operation of the apparatus, due to it, can be avoided. Thus, a liquid immersion type exposure apparatus by which the productivity in semiconductor device manufacture can be improved, is accomplished.

[Embodiment 5]

Next, referring to FIGS. 8 and 9, an embodiment of a device manufacturing method which uses an exposure apparatus according to any one of the embodiments described above, will be explained.

Figure 8:
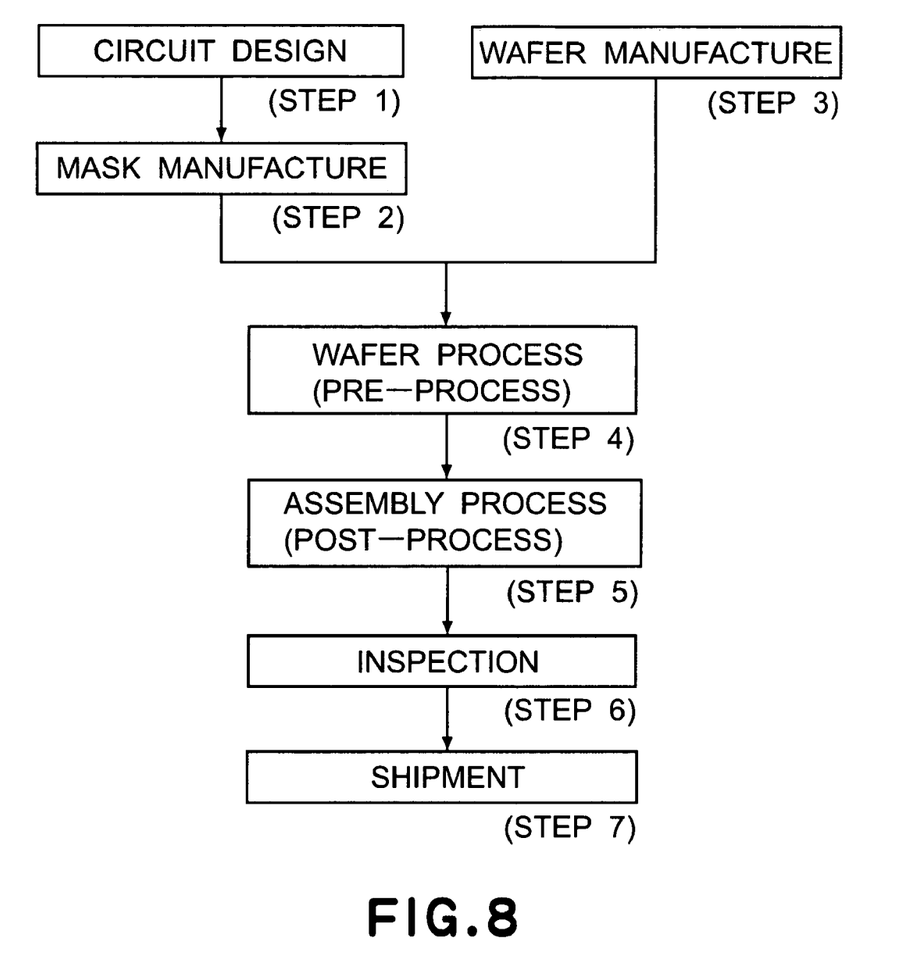
FIG. 8 is a flow chart for explaining device manufacturing processes.

FIG. 8 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 9:
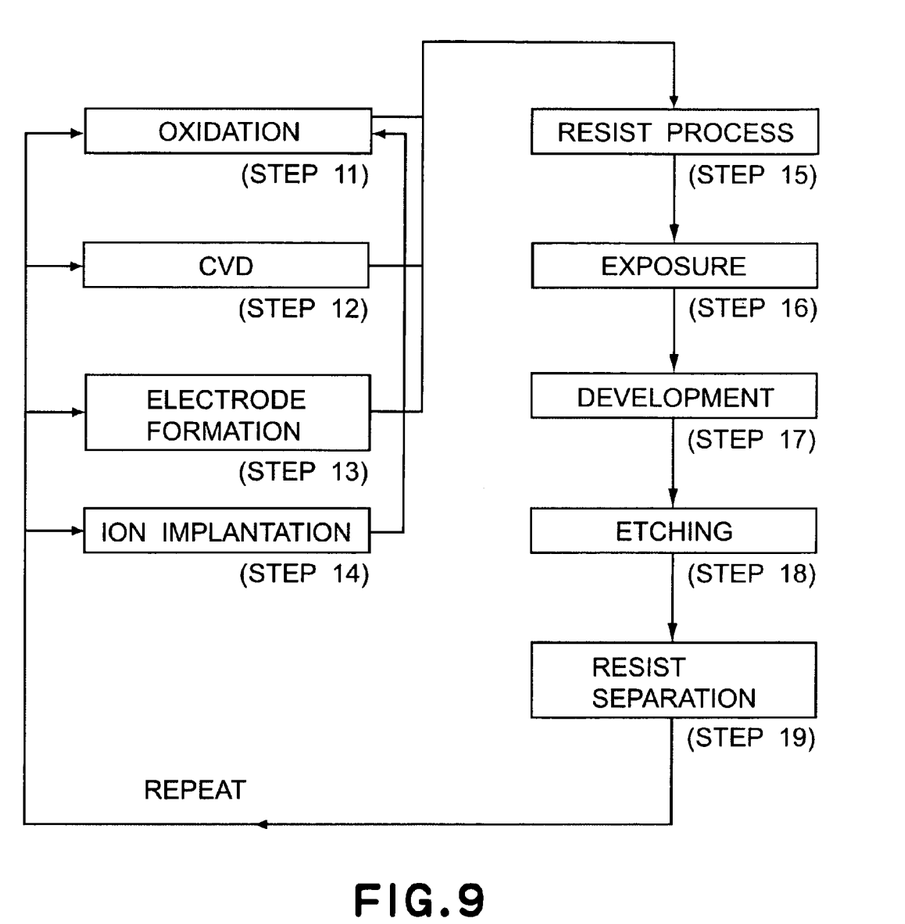
FIG. 9 is a flow chart for explaining a wafer process in the procedure of FIG. 8, in detail.

FIG. 9 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-312635 filed Sep. 4, 2003, for which is hereby incorporated by reference.

What is claimed is:

1. An exposure apparatus comprising:
   a projection optical system for projecting a pattern of a reticle onto a substrate, wherein the substrate is exposed through a liquid medium kept at least in a portion between the substrate and an optical element of said projection optical system which optical element is nearest to the substrate;
   a supplying system for supplying a liquid medium;
   a collecting system for collecting a liquid medium; and
   an exhausting system for removing a bubble in the liquid medium through a bubble removing material having such property that it passes a gas but it does not pass a liquid.

2. An apparatus according to claim 1, wherein a clearance is defined between said bubble removing material and said exhausting system.

3. An apparatus according to claim 1, wherein said supplying system supplies the liquid medium through a liquid supplying material having a liquid absorbing property.

4. An apparatus according to claim 1, wherein said collecting system collects the liquid medium through a liquid collecting material having a liquid absorbing property.

5. An apparatus according to claim 4, wherein said collecting system includes a replacing mechanism for replacing the liquid collecting material.

6. An apparatus according to claim 1, wherein said bubble removing material is disposed at least in a portion of an outer periphery of the optical element.

7. An apparatus according to claim 3, wherein said bubble removing material is disposed at least in a portion of an outer periphery of the optical element, and wherein said liquid supplying material is disposed at least in a portion of an outer periphery of said bubble removing material.

8. An apparatus according to claim 3, wherein said liquid supplying material is disposed at least in a portion of an outer periphery of the optical element, and wherein said bubble removing material is disposed at least in a portion at a side of the substrate which side is remote from the liquid supplying material.

9. An apparatus according to claim 4, wherein said bubble removing material is disposed at least in a portion of an outer periphery of the optical element, and wherein said liquid collecting material is disposed at least in a portion of an outer periphery of said bubble removing material.

10. An apparatus according to claim 1, wherein said collecting system collects the liquid medium through a liquid collecting material having a liquid absorbing property, and wherein said liquid supplying material is disposed at least in a portion of an outer periphery of the optical element while said liquid collecting material is disposed at least in a portion of an outer periphery of said liquid supplying material.

11. An apparatus according to claim 8, wherein said collecting system collects the liquid medium through a liquid collecting material having a liquid absorbing property, and wherein said liquid supplying material is disposed at least in a portion of an outer periphery of the optical element while said liquid collecting material is disposed at least in a portion of an outer periphery of said liquid supplying material.

12. An apparatus according to claim 3, further comprising a first controller for controlling the liquid medium supplying rate of said supplying system so as to maintain a state that the amount of liquid absorption of the liquid supplying material is substantially saturated.

13. An apparatus according to claim 12, further comprising a second controller for controlling the liquid medium supplying rate of said supplying system substantially at the same level as the liquid medium supplying rate as controlled by said first controller.

14. An apparatus according to claim 4, further comprising a controller for controlling the liquid medium collecting rate of said collecting system so as to maintain a state that the amount of liquid absorption of said liquid collecting material is not saturated.

15. A device manufacturing method comprising the steps of:
 exposing a substrate by use of an exposure apparatus as recited in claim 1; and
 developing the exposed substrate.

* * * * *